(12) United States Patent
Chiang et al.

(10) Patent No.: US 10,177,036 B2
(45) Date of Patent: Jan. 8, 2019

(54) SEMICONDUCTOR ARRANGEMENT WITH FINS HAVING MULTIPLE HEIGHTS AND A DIELECTRIC LAYER RECESSED IN THE SUBSTRATE

(71) Applicant: Taiwan Semiconductor Manufacturing Company Limited, Hsin-Chu (TW)

(72) Inventors: Tsung-Yu Chiang, New Taipei (TW); Kuang-Hsin Chen, Jung-Li (TW); Hsin-Lung Chao, Hsinchu (TW); Chen Chu-Hsuan, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 15/892,444

(22) Filed: Feb. 9, 2018

(65) Prior Publication Data
US 2018/0174914 A1    Jun. 21, 2018

Related U.S. Application Data

(60) Continuation of application No. 15/368,786, filed on Dec. 5, 2016, now Pat. No. 9,911,658, which is a
(Continued)

(51) Int. Cl.
*H01L 23/544* (2006.01)
*H01L 29/66* (2006.01)
(Continued)

(52) U.S. Cl.
CPC .. *H01L 21/823431* (2013.01); *H01L 21/3085* (2013.01); *H01L 21/76224* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 7,501,674 B2    3/2009 Lee et al.
8,617,996 B1 *  12/2013 Chi .................... H01L 21/30604
                                          257/E21.377
(Continued)

FOREIGN PATENT DOCUMENTS

JP    2013115427 A     6/2013
KR    20060034531      4/2006
KR    20110033033 A    3/2011

*Primary Examiner* — Marc Anthony Armand
*Assistant Examiner* — Younes Boulghassoul
(74) *Attorney, Agent, or Firm* — Cooper Legal Group, LLC

(57) ABSTRACT

Among other things, one or semiconductor arrangements, and techniques for forming such semiconductor arrangements are provided. An etch sequence is performed to form a first etched region over a planar region of a semiconductor arrangement. The first etched region exposes a planar structure, such as an alignment mark used for alignment during semiconductor fabrication. The etch sequence forms a second etched region over a semiconductor fin region of the semiconductor arrangement. In an embodiment, the etch sequence forms a first trench, a first fin nub and a first pillar in the semiconductor fin region, where the first trench is formed in a semiconductor substrate of the semiconductor fin region. A multi-depth STI structure is formed over at least one of the first trench, the first fin nub, or the first pillar.

20 Claims, 9 Drawing Sheets

Related U.S. Application Data division of application No. 14/024,885, filed on Sep. 12, 2013, now Pat. No. 9,515,184.

(51) Int. Cl.
    *H01L 27/088*   (2006.01)
    *H01L 29/78*    (2006.01)
    *H01L 21/8234*  (2006.01)
    *H01L 21/762*   (2006.01)
    *H01L 21/308*   (2006.01)
    *H01L 29/10*    (2006.01)

(52) U.S. Cl.
    CPC ........ *H01L 23/544* (2013.01); *H01L 27/0886* (2013.01); *H01L 29/1033* (2013.01); *H01L 29/6681* (2013.01); *H01L 29/785* (2013.01); *H01L 2223/54426* (2013.01); *H01L 2223/54453* (2013.01); *H01L 2924/0002* (2013.01)

(58) Field of Classification Search
    CPC ......... H01L 27/10826; H01L 27/10879; H01L 27/1211; H01L 29/41791; H01L 29/66795–29/66818; H01L 29/785–29/7856; H01L 2029/7857–2029/7858; H01L 2924/13067; H01L 21/76224; H01L 21/76229; H01L 21/76232; H01L 21/823481; H01L 21/823878; H01L 29/0649; H01L 29/0653; H01L 23/544; H01L 2223/54426; H01L 2223/54453; H01L 21/308–21/3088; H01L 29/0657; H01L 29/0684; H01L 29/7853; H01L 29/1037

See application file for complete search history.

(56) References Cited

U.S. PATENT DOCUMENTS

| | | | |
|---|---|---|---|
| 8,753,940 B1* | 6/2014 | Wei | H01L 21/845 257/E21.429 |
| 8,759,904 B2* | 6/2014 | Wahl | H01L 21/823431 257/328 |
| 2008/0029821 A1* | 2/2008 | Yamagami | H01L 21/823807 257/365 |
| 2012/0313169 A1* | 12/2012 | Wahl | H01L 21/823431 257/347 |
| 2013/0026571 A1* | 1/2013 | Kawa | H01L 27/0207 257/347 |
| 2013/0277720 A1* | 10/2013 | Kim | H01L 29/785 257/288 |
| 2013/0309838 A1* | 11/2013 | Wei | H01L 21/76229 438/424 |
| 2014/0327074 A1* | 11/2014 | Tsao | H01L 27/0886 257/337 |
| 2015/0076653 A1* | 3/2015 | Hu | H01L 21/76224 257/506 |

* cited by examiner

US 10,177,036 B2

SEMICONDUCTOR ARRANGEMENT WITH FINS HAVING MULTIPLE HEIGHTS AND A DIELECTRIC LAYER RECESSED IN THE SUBSTRATE

RELATED APPLICATION

This application is a continuation of and claims priority to U.S. patent application Ser. No. 15/368,786, now titled "METHODS FOR FORMING A SEMICONDUCTOR ARRANGEMENT WITH MULTIPLE-HEIGHT FINS AND SUBSTRATE TRENCHES" and filed on Dec. 5, 2016, which is a divisional of and claims priority to U.S. patent application Ser. No. 14/024,885, now titled "SEMICONDUCTOR ARRANGEMENT WITH MULTIPLE-HEIGHT FINS AND SUBSTRATE TRENCHES" and filed on Sep. 12, 2013. U.S. patent application Ser. Nos. 15/368,786 and 14/024,885 are incorporated herein by reference.

BACKGROUND

A transistor, such as a FinFET transistor, comprises a source region, a drain region, and a channel region between the source region and the drain region. For a FinFET transistor, the channel region is formed as a fin structure. The transistor comprises a gate region that controls the channel region to operate the transistor. The gate region is formed around one or more surfaces of the channel region, which provides the gate region with increased control over the channel region because the transistor is controlled by a 3D gate area. Fabrication of a semiconductor device, such as a FinFET transistor, involves one or more masks that are used for patterning, such as in lithography. Alignment marks are used to align the one or more masks with one or more layers of the semiconductor device.

DETAILED DESCRIPTION

Figure 1:
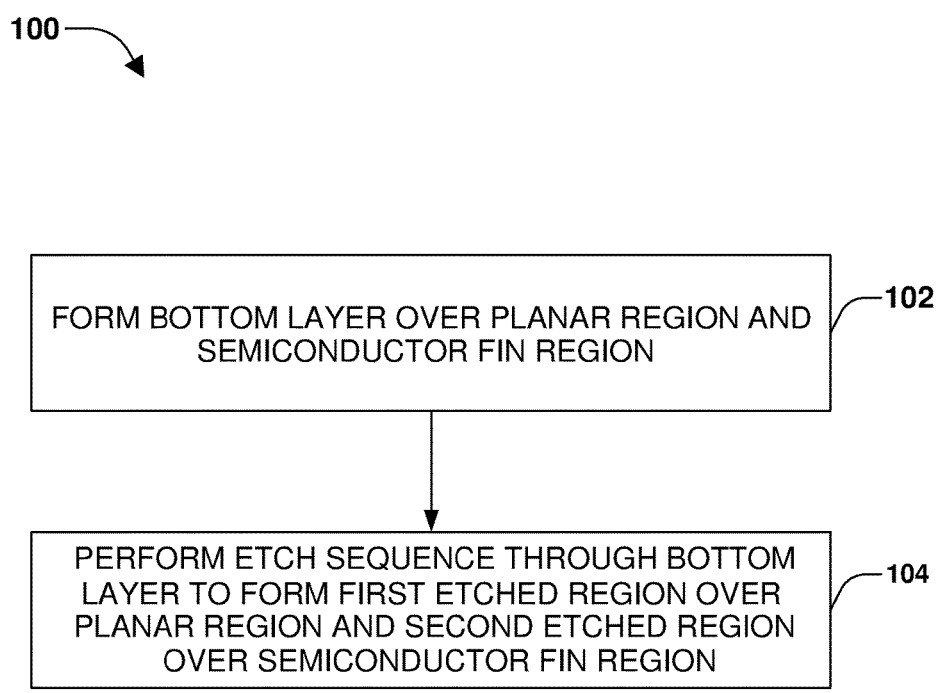
FIG. 1 is a flow diagram illustrating a method of forming a semiconductor arrangement, according to some embodiments.
Figure 2:
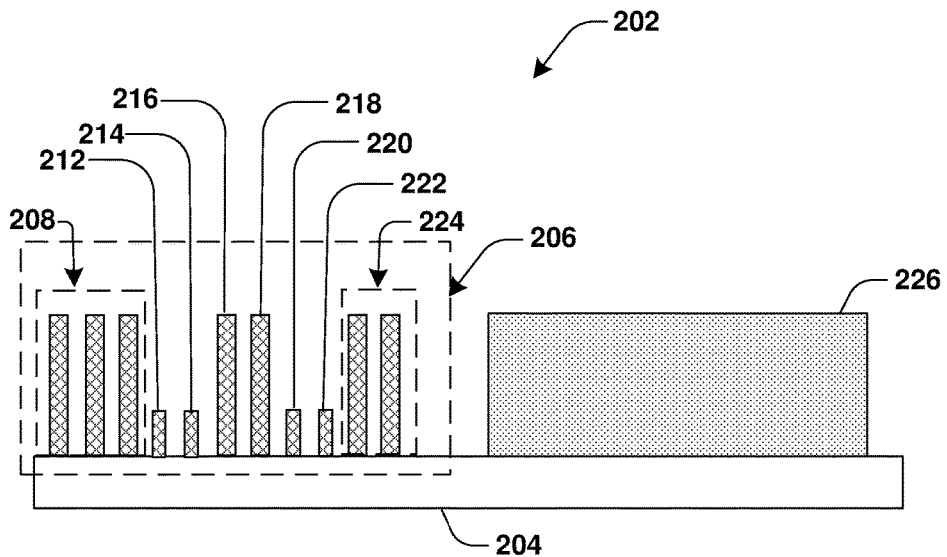
FIG. 2 is an illustration of a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more semiconductor arrangements, and one or more techniques for forming such semiconductor arrangements are provided herein. In an embodiment, a semiconductor arrangement corresponds to one or more FinFET devices. The semiconductor arrangement comprises a semiconductor fin region. The semiconductor fin region comprises one or more fins that function as channels of one or more FinFET devices. The semiconductor arrangement comprises a planar region comprising a planar structure. In an embodiment, the planar structure comprises an alignment mark used for alignment purposes during fabrication. During fabrication, one or more layers are etched to expose the planar structure for alignment or to expose a portion of the semiconductor fin region for STI formation. A difference in etching occurs because of topology differences on the semiconductor arrangement. The difference in etching associated with the planar region and the semiconductor fin region results in overlap (OVL) alignment issues because material is not etched away to adequately reveal the alignment mark. In an embodiment, a fin etch region depth of between about 1000 A and about 1400 A is achieved in the semiconductor fin region, while a planar etch region depth of between about 1800 A and about 2200 A is achieved in the planar region. However, even though the planar etch region depth is greater than the fin etch region depth, at least some material remains over the alignment mark due to topology differences of the semiconductor arrangement, and thus the alignment mark is not sufficiently exposed for alignment purposes. Accordingly, as provided herein, an etch sequence is performed to expose the planar structure and to form multi-depth etch regions for STI formation within the semiconductor fin region.

A method 100 of forming a semiconductor arrangement is illustrated in FIG. 1, and one or more semiconductor arrangements formed by such a methodology are illustrated in FIGS. 2-7. A semiconductor arrangement 202 comprises a planar region comprising a planar structure 226 formed over a substrate 204, such as a silicon substrate, of the semiconductor arrangement 202, as illustrated in embodiment 200 of FIG. 2. In an embodiment, the planar structure 226 comprises an alignment mark or overlay mark used for alignment during fabrication, such as alignment of a pattern mask. The semiconductor arrangement 202 comprises a semiconductor fin region 206. The semiconductor fin region 206 comprises a first set of semiconductor fins 208 and a second set of semiconductor fins 224. In an embodiment, a semiconductor fin corresponds to a channel of a FinFET transistor. In an embodiment, one or more sacrificial or dummy fins are comprised within the semiconductor fin region 206, such as a first fin 212, a second fin 214, a third fin 216, a fourth fin 218, a fifth fin 220, and a sixth fin 222. In some embodiments other layers, not illustrated, are formed within the semiconductor arrangement 202, such as a hard mask or oxide (SiN/SiO) layer formed over the planar structure 226 or over one or more fin structures within the semiconductor fin region 206.

Figure 3:
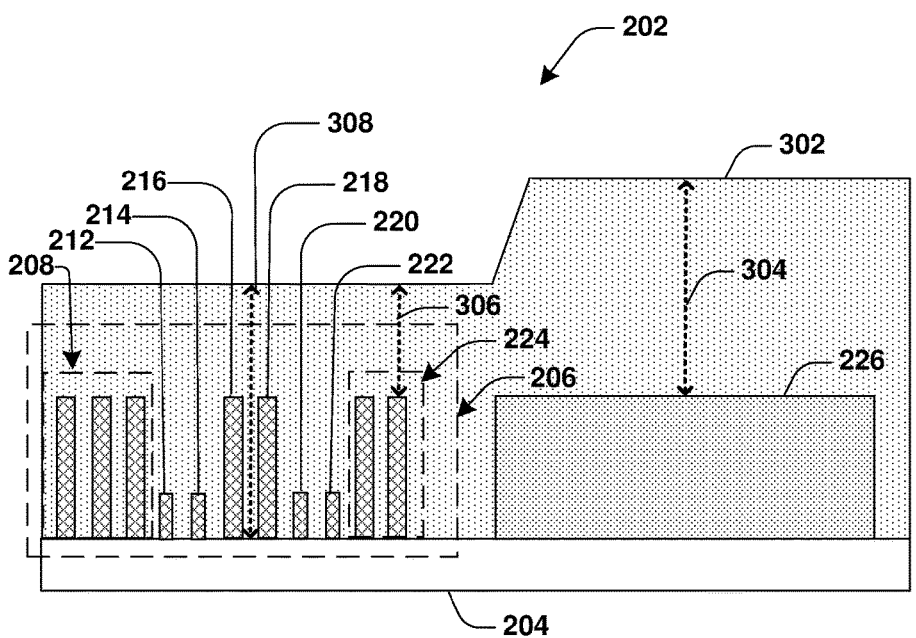
FIG. 3 is an illustration of a semiconductor arrangement comprising a bottom layer, according to some embodiments.

At 102, a bottom layer 302 is formed over the planar structure 226 and over the semiconductor fin region 206, as illustrated in FIG. 3. In an embodiment, the bottom layer 302 comprises C-rich material or a photo resist material used in photolithography. In an embodiment, a portion of the bottom layer 302 over the planar structure 226 has a first thickness 304 between about 1800 A and about 2200 A. In an embodiment, a portion of the bottom layer 302 between a top surface of the bottom layer 302 and a top surface of a semiconductor fin within the first set of semiconductor fins 224 has a second thickness 306 between about 1000 A and about 1400 A. In an embodiment, a semiconductor fin has a fin height 606, illustrated in embodiment 600 of FIG. 6A, between about 1100 A and about 1500 A such that a portion of the bottom layer 302, formed over the semiconductor fin region 206, has a thickness 308 between about 2100 A and about 2900 A. In some embodiments other layers, not illustrated, are formed within the semiconductor arrangement 202, such as a middle layer comprising a photo resist material or a hard mask, such a nitride mask or photo resist mask, formed over portions of the semiconductor arrangement 202 that are to be protected or remain after etching.

Figure 4:
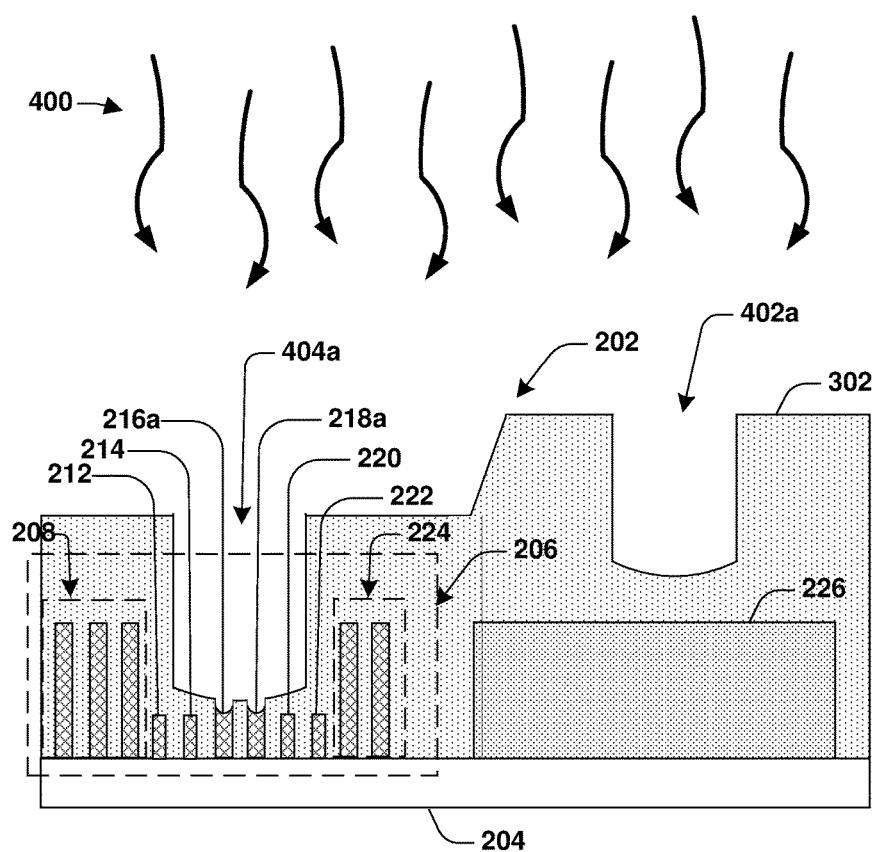
FIG. 4 is an illustration of a first etch, according to some embodiments.
Figure 5:
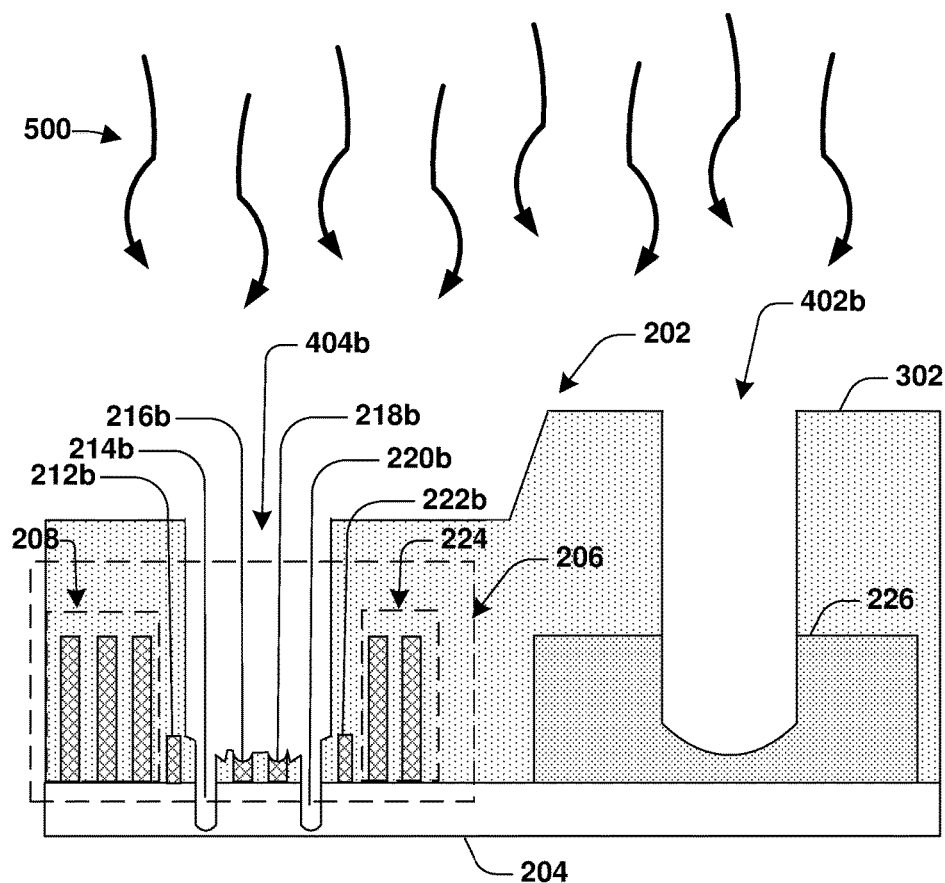
FIG. 5 is an illustration of a second etch, according to some embodiments.

At 104, an etch sequence through the bottom layer 302 is performed to form a first etched region 402b over the planar structure 226 and to form a second etched region 404b over the semiconductor fin region 206, as illustrated by first etch 400 of FIG. 4 and second etch 500 of FIG. 5. In an embodiment, the etch sequence results in at least one of one or more fin nubs, one or more trenches, or one or more pillars, as illustrated by first fin nub 216b, first trench 214b, and first pillar 212b in embodiment of FIG. 5.

In an embodiment of the first etch 400, a first partial etched region 402a is formed over the planar structure 226 by the first etch 400, as illustrated in FIG. 4. A second partial etched region 404a is formed over the semiconductor fin region 206 by the first etch 400, as illustrated in FIG. 4. In an embodiment, the first etch 400 comprises a SiN+Si etch chemistry to remove a portion of one or more dummy fins, such as the third fin 216 resulting in partially etched third fin 216a and the fourth fin 218 resulting in partially etched fourth fin 218a.

In an embodiment of the second etch 500, the first etched region 402b is formed over the planar structure 226 by the second etch 500 further etching the first partial etched region 402a, as illustrated in FIG. 5. The second etched region 404b is formed over the semiconductor fin region 206 by the second etch 500 further etching the second partial etched region 404a. In an embodiment, the second etch 500 uses an etch gas, such as CF, CHF, or HBr. In an embodiment, the second etch 500 exposes a surface of the planar structure 226. In an embodiment, the second etch 500 removes a portion of the partially etched third fin 216a to create a first fin nub 216b. In an embodiment, the second etch 500 removes a portion of the partially etched fourth fin 218a to create a second fin nub 218b. In an embodiment, the second etch 500 removes the second fin 214 to create a first trench 214b formed into the substrate 204. In an embodiment, the second etch 500 removes the fifth fin 220 to create a second trench 220b formed into the substrate 204. In an embodiment, the first fin 212 remains as a first pillar 212b. In an embodiment, the sixth fin 222 remains as a second pillar 222b.

Figure 6A:
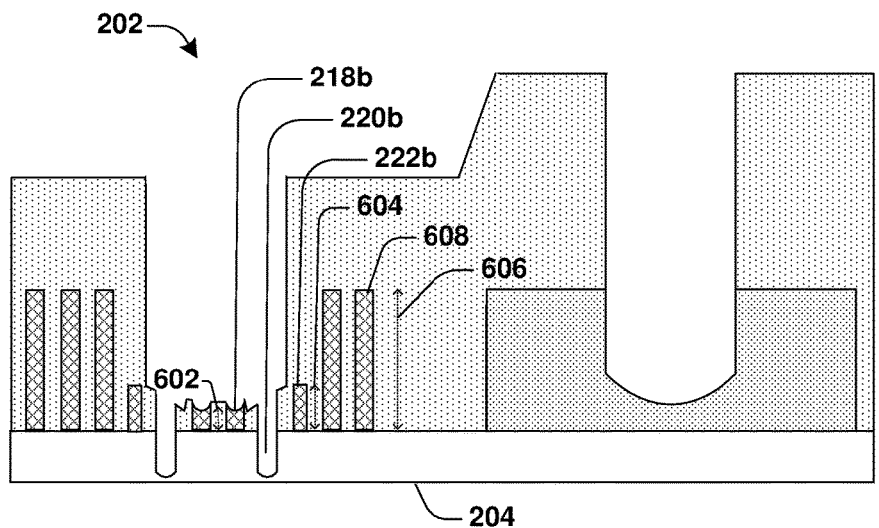
FIG. 6A is an illustration of a semiconductor arrangement, according to some embodiments.
Figure 6B:
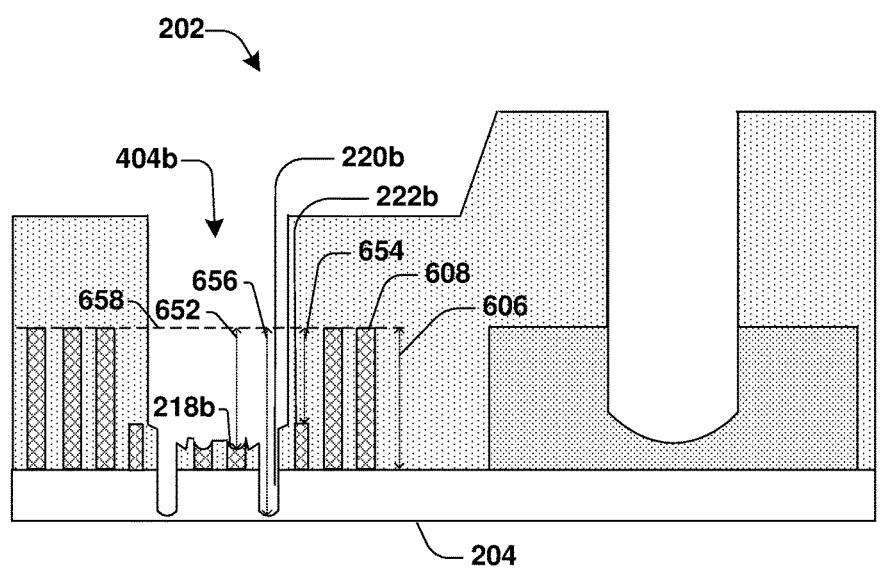
FIG. 6B is an illustration of a semiconductor arrangement, according to some embodiments.

The semiconductor arrangement 202 comprises a semiconductor fin 608, as illustrated in FIG. 6A. The semiconductor fin 608 has a fin height 606. In an embodiment, the fin height 606 is between about 1100 A and about 1500 A. The second pillar 222b has a pillar height 604 that is less than the fin height 606. In an embodiment, the pillar height 604 is between about 0.3 and about 0.6 of the fin height 606. The second fin nub 218b has a nub height 602 that is less than at least one of the fin height 606 or the pillar height 604. In an embodiment, the nub height 602 is between about 0 and about 0.25 of the fin height 606.

In an embodiment, an STI layer, not illustrated, is formed over the substrate 204, such as within the second etch region 404b over the semiconductor fin region 206. In an embodiment, the STI layer is formed as a multi-depth STI structure. The multi-depth STI structure corresponds to a first depth 652 from a top semiconductor fin surface, illustrated by line 658 in FIG. 6B, to a top surface of the second nub 218b. The multi-depth STI structure corresponds to a second depth 656 from the top semiconductor fin surface to a bottom surface of the second trench 220b. In an embodiment, the multi-depth STI structure corresponds to a third depth 654 from the top semiconductor fin surface to a top surface of the second pillar 222b.

Figure 6C:
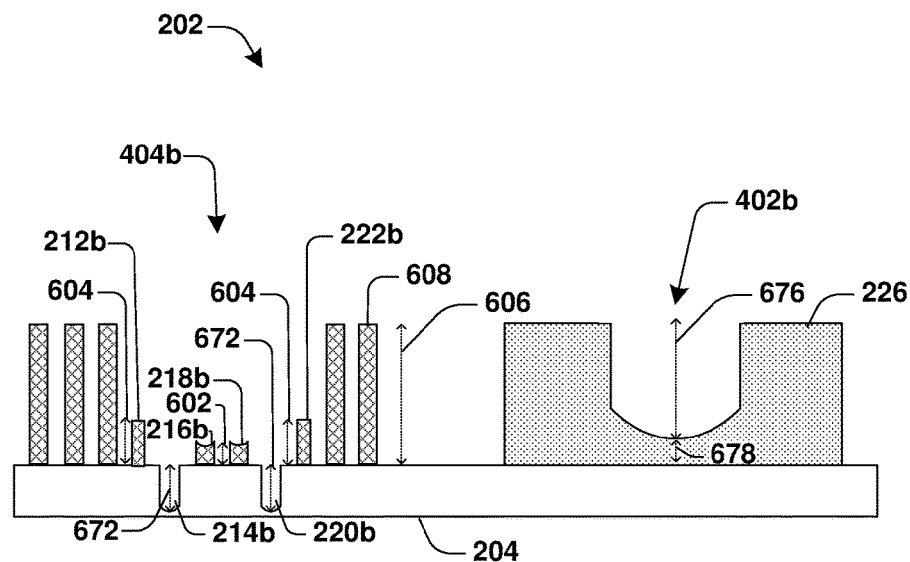
FIG. 6C is an illustration of a semiconductor arrangement, according to some embodiments.

At least one of the first fin nub 216b or the second fin nub 218b has a nub height 602 that is less than the fin height 606 of the semiconductor fin 608, as illustrated in FIG. 6C. In an embodiment, the nub height 602 has a height ratio difference between about ⅒ and about ½ the fin height 606. At least one of the first trench 214b or the second trench 220b are formed into the substrate 204 at a depth 672. In an embodiment, the depth 672 has a depth ratio difference between about ½ and about 9/10 of a thickness of the substrate 204. In an embodiment, the depth 672 is greater than the nub height 602. In an embodiment, the depth 672 is less than the fin height 606. At least one of the first pillar 212b or the second pillar 222b have a pillar height 604 that is less than the fin height 606 of the semiconductor fin 608. In an embodiment, the pillar height 604 is greater than the nub height 602. The first etched region 402b has a first etched depth 676, such that a portion of the planar structure 226 has a planar structure height 678. In an embodiment, the first etched depth 676 of the first etched region 402b is less than the fin height 606 of the semiconductor fin 608. In an embodiment, the planar structure height 678 corresponds to the nub height 602.

Figure 6D:
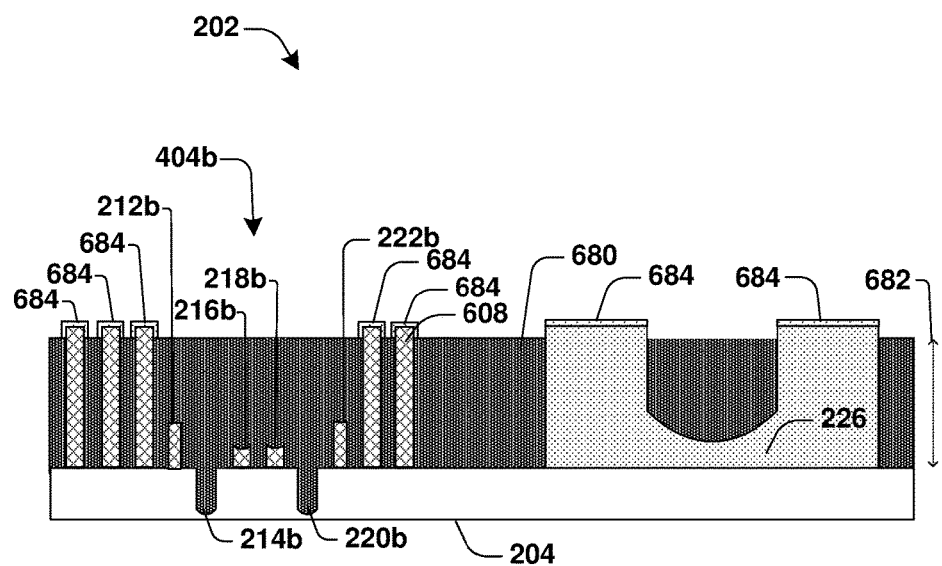
FIG. 6D is an illustration of a shallow trench isolation (STI) layer of a semiconductor arrangement, according to some embodiments.
Figure 6E:
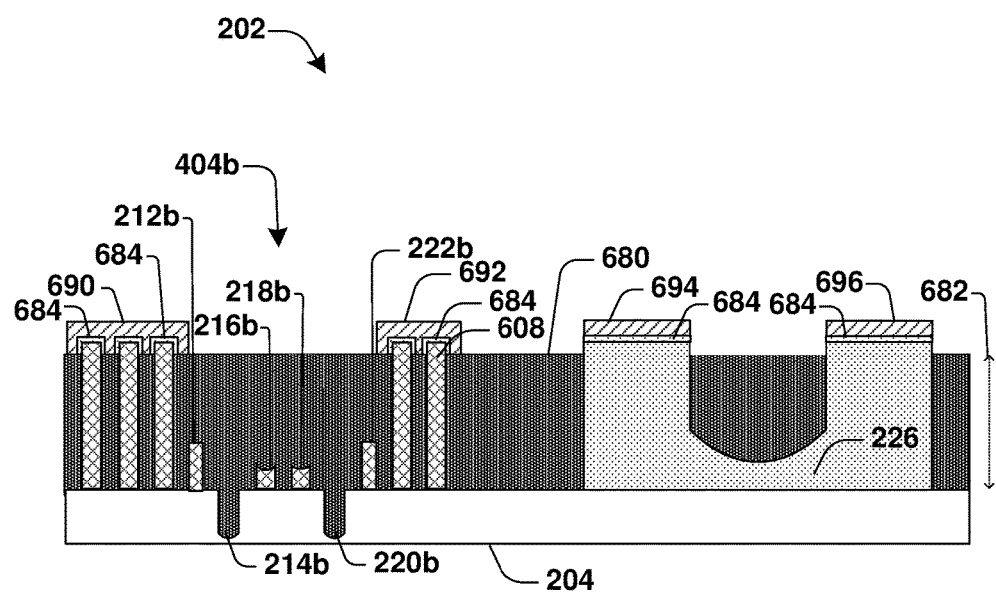
FIG. 6E is an illustration of one or more gate structures of a semiconductor arrangement, according to some embodiments.

In an embodiment, a shallow trench isolation (STI) layer 680 is formed over the substrate 204 to a thickness or height 682, as illustrated in FIG. 6D. A gate oxide layer 684 is formed over the semiconductor fins, such as the semiconductor fin 608. In an embodiment, one or more gate structures, such as a first gate structure 690 and a second gate structure 692 are formed over the gate oxide layer 684, as illustrated in FIG. 6E. In an embodiment, the gate oxide layer 684 is formed over a portion of the planar structure 226. A third gate structure 694 and a fourth gate structure 696 are formed over the gate oxide layer 684 formed over the planar structure 226.

Figure 6F:
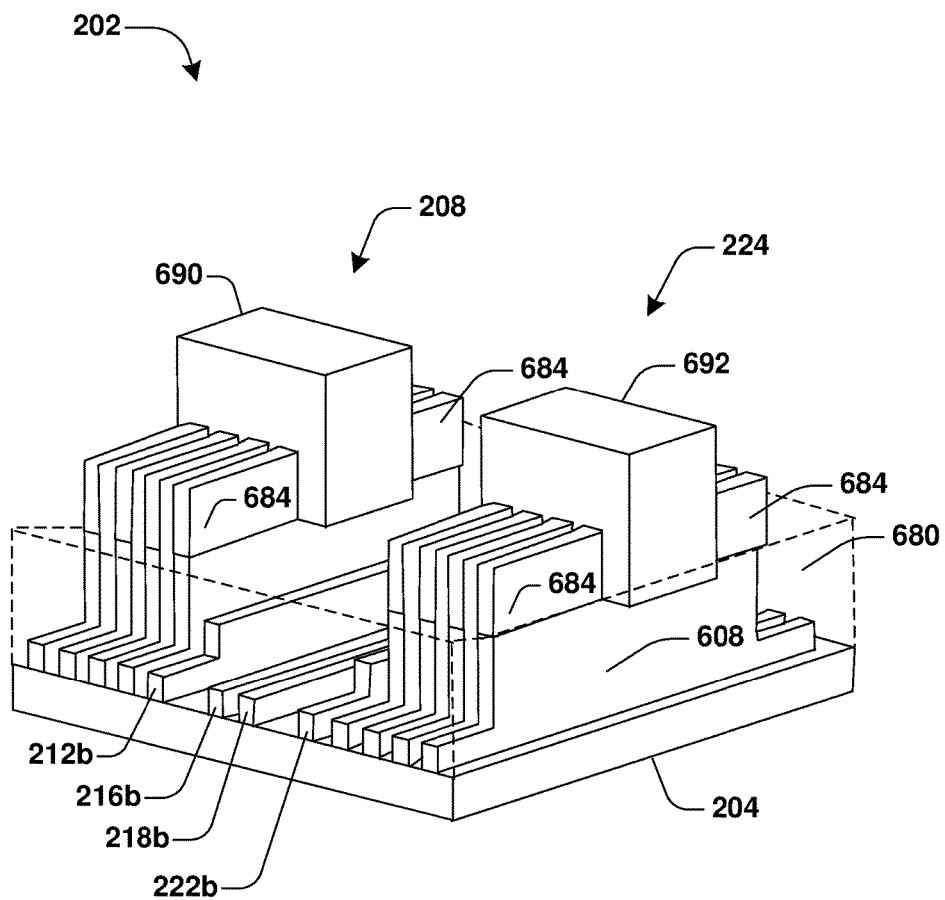
FIG. 6F is an illustration of a perspective view of a semiconductor arrangement, according to some embodiments.

FIG. 6F illustrates a perspective view of the semiconductor arrangement 202. The perspective view illustrates the first set of semiconductor fins 208 and the second set of semiconductor fins 224 formed over the semiconductor substrate 204. The STI layer 680 is formed over the first set of semiconductor fins 208 and the second set of semiconductor fins 224. The gate oxide layer 684 is formed over the first set of semiconductor fins 208 and the second set of semiconductor fins 224, such as over the semiconductor fin 608. The first gate structure 690 is formed over the first set of semiconductor fins 208. The second gate structure 692 is formed over the second set of semiconductor fins 224. The first fin nub 216b and the second fin nub 218b are formed between the first set of semiconductor fins 208 and the second set of semiconductor fins 224. The first pillar 212b is formed between the first fin nub 216b and the first set of semiconductor fins 208. The second pillar 222b is formed between the second fin nub 218b and the second set of semiconductor fins 224.

Figure 7:
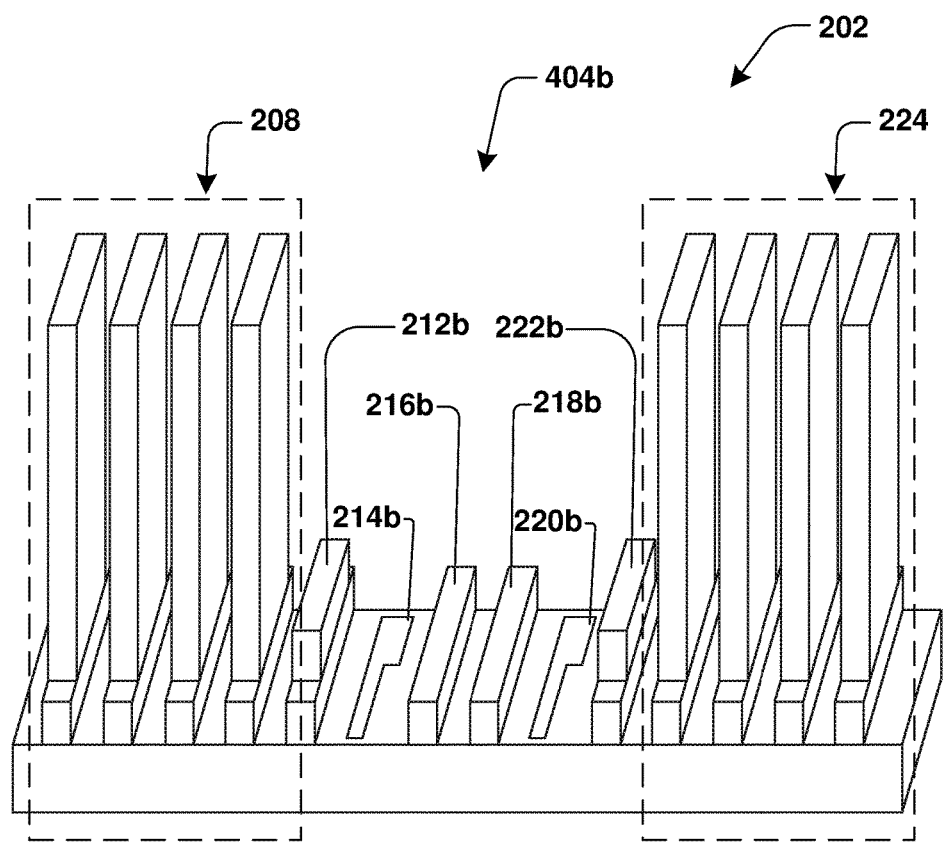
FIG. 7 is an illustration of a perspective view of a semiconductor arrangement, according to some embodiments.

FIG. 7 illustrates a perspective view of the semiconductor arrangement 202. The perspective view illustrates the first set of semiconductor fins 208 and the second set of semiconductor fins 224. The first fin nub 216b and the second fin nub 218b are formed between the first set of semiconductor fins 208 and the second set of semiconductor fins 224. The first pillar 212b is formed between the first fin nub 216b and the first set of semiconductor fins 208. The first trench 214b is formed between the first fin nub 216b and the first pillar 212b. The second pillar 222b is formed between the second fin nub 218b and the second set of semiconductor fins 224. The second trench 220b is formed between the second fin nub 218b and the second pillar 222b.

According to an aspect of the instant disclosure, a semiconductor arrangement is provided. The semiconductor arrangement comprises a semiconductor substrate. The semiconductor arrangement comprises a planar region formed over the semiconductor substrate. The planar region comprises a planar structure. The semiconductor arrangement comprises a semiconductor fin region formed over the semiconductor substrate. The semiconductor fin region comprises a first fin nub formed between a first set of semiconductor fins and a second set of semiconductor fins. The semiconductor fin region comprises a first trench formed into the semiconductor substrate. The first trench is formed between the first set of semiconductor fins and the second set of semiconductor fins.

According to an aspect of the instant disclosure, a semiconductor arrangement is provided. The semiconductor arrangement comprises a semiconductor substrate. The semiconductor arrangement comprises a first planar region formed over the semiconductor substrate. The planar region comprises a planar structure. The semiconductor arrangement comprises a semiconductor fin region formed over the semiconductor substrate. The semiconductor fin region comprises a first trench formed into the semiconductor substrate. The first trench is formed between a first set of semiconductor fins and a second set of semiconductor fins.

According to an aspect of the instant disclosure, a method for forming a semiconductor arrangement is provided. The method comprises forming a planar region over the semiconductor substrate. The planar region comprises a planar structure. A semiconductor fin region is formed over the semiconductor substrate. A bottom layer is formed over the planar region and the semiconductor fin region. An etch sequence is performed through the bottom layer. The etch sequence forms a first trench into the semiconductor substrate of the semiconductor fin region.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a first semiconductor fin protruding from a substrate and having a first height;
   a first semiconductor fin nub protruding from the substrate and having a second height less than the first height;
   a dielectric layer in contact with a sidewall of the first semiconductor fin, a sidewall of the first semiconductor fin nub, and a sidewall of the substrate; and an alignment mark overlaying the substrate, wherein the dielectric layer is in contact with a sidewall of the alignment mark.

2. The semiconductor arrangement of claim 1, wherein the substrate defines a trench disposed between the first semiconductor fin and the first semiconductor fin nub.

3. The semiconductor arrangement of claim 2, wherein the dielectric layer is disposed within the trench.

4. The semiconductor arrangement of claim 1, comprising:
a first semiconductor pillar disposed between the first semiconductor fin and the first semiconductor fin nub, wherein:
the first semiconductor pillar has a third height less than the first height and greater than the second height, and
the dielectric layer is in contact with a sidewall of the first semiconductor pillar.

5. The semiconductor arrangement of claim 1, comprising:
a gate structure disposed over the first semiconductor fin and adjacent the sidewall of the first semiconductor fin.

6. The semiconductor arrangement of claim 5, wherein the first semiconductor fin nub is spaced apart from the gate structure by the dielectric layer.

7. The semiconductor arrangement of claim 1, wherein:
the alignment mark defines a trench, and
the dielectric layer is disposed within the trench.

8. A semiconductor arrangement, comprising:
a first semiconductor fin protruding from a substrate and having a first height;
a first semiconductor pillar protruding from the substrate and having a second height less than the first height;
a first semiconductor fin nub protruding from the substrate and having a third height less than the second height, wherein the substrate defines a trench disposed between the first semiconductor fin and the first semiconductor fin nub; and
a dielectric layer, wherein:
the dielectric layer is adjacent a sidewall of the first semiconductor fin,
the dielectric layer is adjacent a sidewall of the first semiconductor pillar and overlies a top surface of the first semiconductor pillar, and
the dielectric layer is adjacent a sidewall of the first semiconductor fin nub.

9. The semiconductor arrangement of claim 8, wherein the dielectric layer overlies a top surface of the first semiconductor fin nub.

10. The semiconductor arrangement of claim 8, wherein the top surface of the first semiconductor pillar has a first profile and a top surface of the first semiconductor fin nub has a second profile.

11. The semiconductor arrangement of claim 8, wherein the top surface of the first semiconductor pillar is substantially planar and a top surface of the first semiconductor fin nub is non-planar.

12. The semiconductor arrangement of claim 8, wherein a first portion of the first semiconductor fin protrudes above a top surface of the dielectric layer.

13. The semiconductor arrangement of claim 12, comprising:
a gate structure partially surrounding the first portion of the first semiconductor fin.

14. The semiconductor arrangement of claim 8, wherein the dielectric layer is disposed within the trench.

15. A semiconductor arrangement, comprising:
a first semiconductor fin protruding from a substrate and having a first height;
a first semiconductor fin nub protruding from the substrate and having a second height less than the first height; and
a dielectric layer disposed over the first semiconductor fin nub and adjacent the first semiconductor fin, wherein:
the dielectric layer extends below a bottom surface of the first semiconductor fin and the first semiconductor fin nub, and
the dielectric layer is in contact with a top surface of the first semiconductor fin nub.

16. The semiconductor arrangement of claim 15, comprising:
an alignment mark overlaying the substrate, wherein the dielectric layer is in contact with a sidewall of the alignment mark.

17. A semiconductor arrangement, comprising:
a first semiconductor fin protruding from a substrate and having a first height;
a first semiconductor fin nub protruding from the substrate and having a second height less than the first height;
a dielectric layer disposed over the first semiconductor fin nub and adjacent the first semiconductor fin, wherein the dielectric layer extends below a bottom surface of the first semiconductor fin and the first semiconductor fin nub; and
an alignment mark overlaying the substrate, wherein the dielectric layer is in contact with a sidewall of the alignment mark.

18. The semiconductor arrangement of claim 17, wherein:
the alignment mark defines a trench, and
the dielectric layer is disposed within the trench.

19. The semiconductor arrangement of claim 17, wherein the substrate defines a trench disposed between the first semiconductor fin and the first semiconductor fin nub.

20. The semiconductor arrangement of claim 19, wherein the dielectric layer is disposed within the trench.

* * * * *